(12) United States Patent
Amin et al.

(10) Patent No.: US 12,718,886 B2
(45) Date of Patent: Aug. 25, 2026

(54) WORD LINE BIAS DURING STRIPE ERASE IN A MEMORY DEVICE

(71) Applicant: Sandisk Technologies, Inc., Milpitas, CA (US)

(72) Inventors: Parth Amin, Fremont, CA (US); Anubhav Khandelwal, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 230 days.

(21) Appl. No.: 18/384,204

(22) Filed: Oct. 26, 2023

(65) Prior Publication Data

US 2025/0140321 A1 May 1, 2025

(51) Int. Cl.
*G11C 16/16* (2006.01)
*G11C 16/34* (2006.01)

(52) U.S. Cl.
CPC .......... *G11C 16/16* (2013.01); *G11C 16/3445* (2013.01)

(58) Field of Classification Search
CPC ............................ G11C 16/16; G11C 16/3445
USPC .................................................... 365/185.29
See application file for complete search history.

(56) References Cited

U.S. PATENT DOCUMENTS

2014/0185382 A1* 7/2014 Oowada ................. G11C 16/14 365/185.17
2023/0154550 A1* 5/2023 Guo ................... G11C 16/0483 365/185.22

* cited by examiner

*Primary Examiner* — Amir Zarabian
*Assistant Examiner* — Daniel John King
(74) *Attorney, Agent, or Firm* — Dickinson Wright PLLC

(57) ABSTRACT

The memory device includes a memory block with an array of memory cells that are arranged in edge word lines and non-edge word lines. Some of the word lines are in a first group to be erased in a first pulse and the others are in a second group to be erased in a second pulse. Circuitry is configured to erase the memory cells. In the first erase pulse, the circuitry applies a first inhibit voltage to the non-edge word lines of the second group and applies a higher second inhibit voltage to the edge word lines of the second group. In the second erase pulse, the circuitry applies the first inhibit voltage to the non-edge word lines of the first group and applies the higher second inhibit voltage to the edge word lines of the second group.

20 Claims, 17 Drawing Sheets

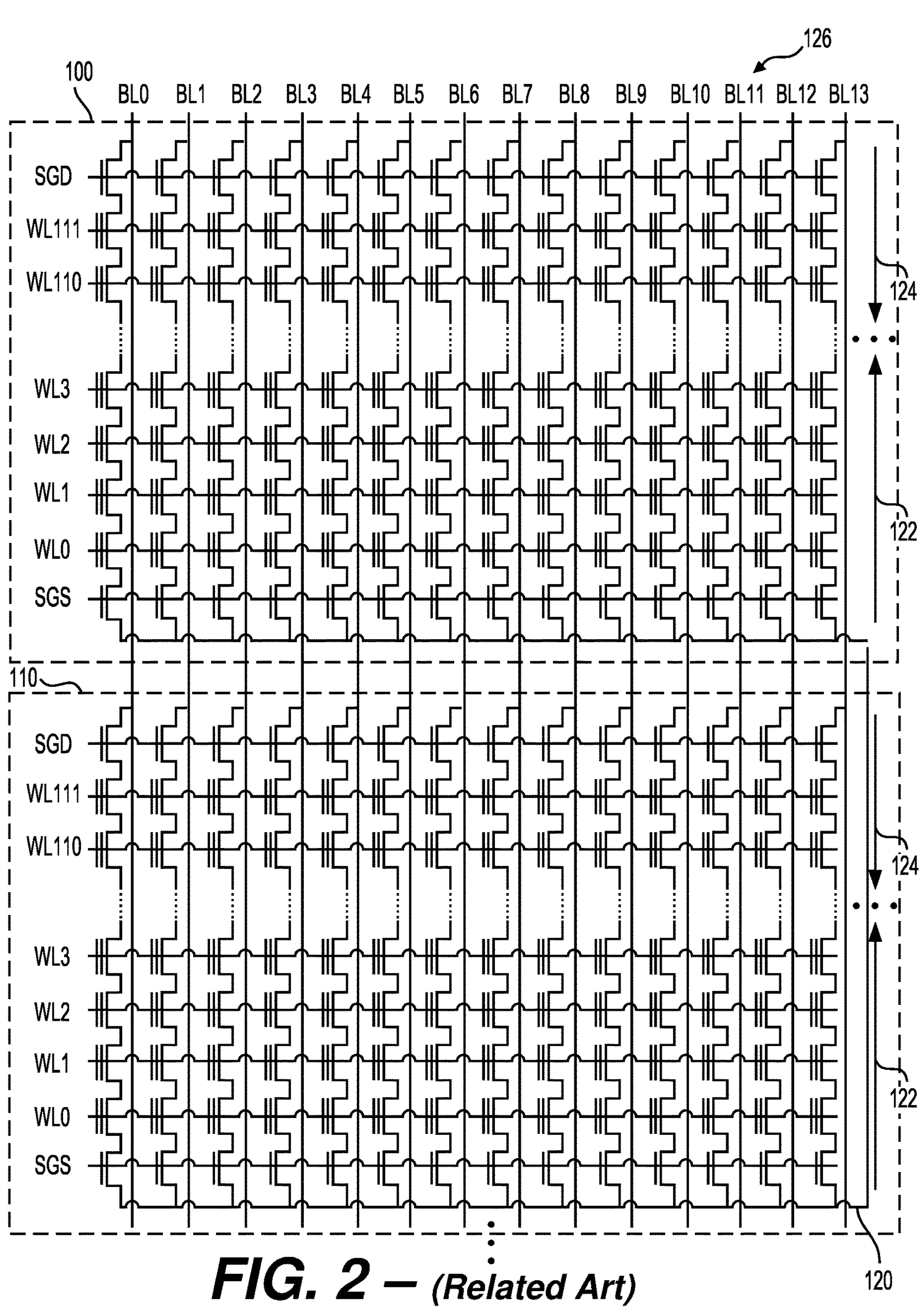
FIG. 2 – (Related Art)

330
SGS, 331
300
333
334
335
SGD, 336
$V_{CH}$
328
302
305
304
sd1
sd2
sd3
sd4
sd5
sd6
sd7

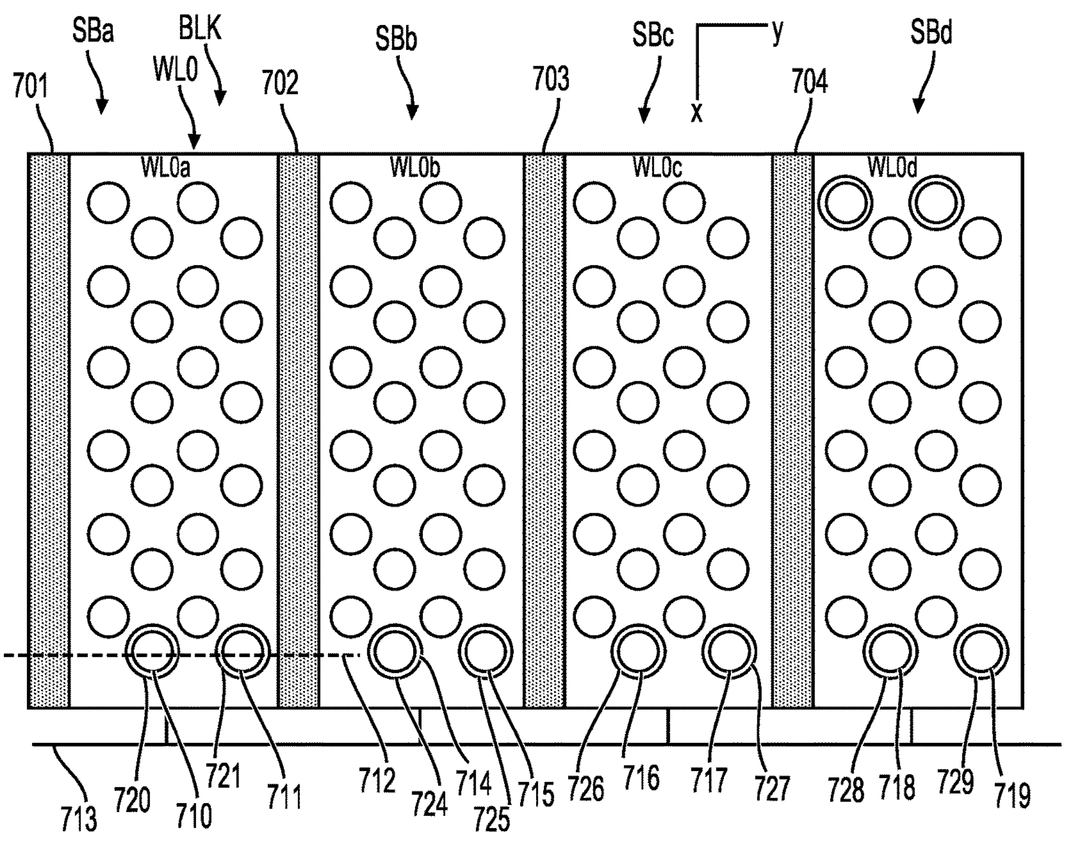
FIG. 7A – (Related Art)
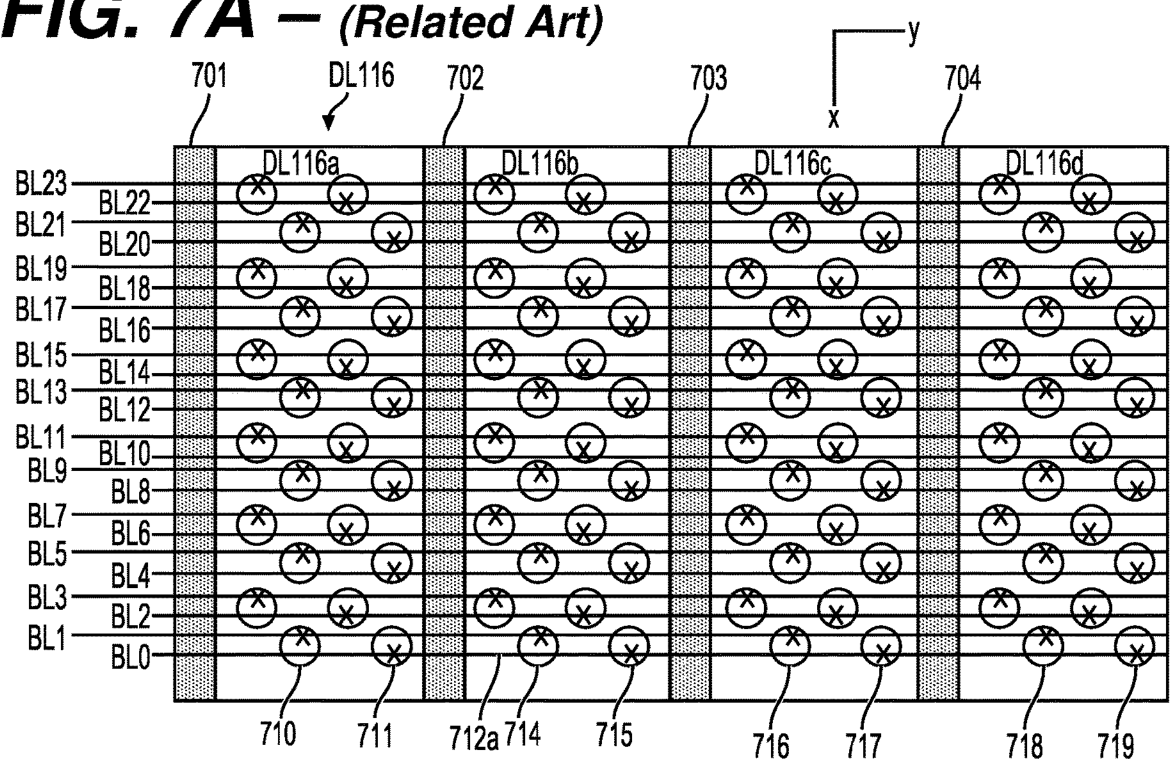
FIG. 7B - (Related Art)

| | ERASE PULSE 1 | ERASE PULSE 2 |
|---|---|---|
| BIT LINES | FLOATING | FLOATING |
| SGD | FLOATING | FLOATING |
| WLN | WLU1_ERA | 0.5 V |
| WLN-1 | 0.5 V | WLU1_ERA |
| WLN-2 | WLU1_ERA | 0.5 V |
| WLN-3 | 0.5 V | WLU1_ERA |
| ... | | |
| WLe1 | WLU1_ERA | 0.5 V |
| WLe2 | 0.5 V | WLU1_ERA |
| ... | | |
| WL3 | WLU1_ERA | 0.5 V |
| WL2 | 0.5 V | WLU1_ERA |
| WL1 | WLU1_ERA | 0.5 V |
| WL0 | 0.5 V | WLU1_ERA |
| SGS | FLOATING | FLOATING |
| SOURCE LINE | FLOATING | FLOATING |
| P-WELL | VERA | VERA |

*FIG. 10*

| | ERASE PULSE 1 | ERASE PULSE 2 |
|---|---|---|
| BIT LINES | FLOATING | FLOATING |
| SGD | FLOATING | FLOATING |
| WLN | WLU1_ERA + BIAS | 0.5 V |
| WLN-1 | 0.5 V | WLU1_ERA |
| WLN-2 | WLU1_ERA | 0.5 V |
| WLN-3 | 0.5 V | WLU1_ERA |
| ... | | |
| WLe1 | WLU1_ERA + BIAS | 0.5 V |
| WLe2 | 0.5 V | WLU1_ERA + BIAS |
| ... | | |
| WL3 | WLU1_ERA | 0.5 V |
| WL2 | 0.5 V | WLU1_ERA |
| WL1 | WLU1_ERA | 0.5 V |
| WL0 | 0.5 V | WLU1_ERA + BIAS |
| SGS | FLOATING | FLOATING |
| SOURCE LINE | FLOATING | FLOATING |
| P-WELL | VERA | VERA |

*FIG. 13*

WORD LINE BIAS DURING STRIPE ERASE IN A MEMORY DEVICE

BACKGROUND

1. Field

The subject disclosure is related generally to techniques for erasing memory cells in word lines and, more particularly, to stripe erase techniques.

2. Related Art

Semiconductor memory is widely used in various electronic devices, such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power, e.g., a battery.

NAND memory devices include a chip with a plurality of memory blocks, each of which includes an array of memory cells arranged in a plurality of word lines. Programming the memory cells of a word line to retain data typically occurs in a plurality of program loops, each of which includes the application of a programming pulse to a control gate of the word line and, optionally, a verify operation to sense the threshold voltages of the memory cells being programmed. Each program loop may also include a pre-charge operation prior to the programming pulse to pre-charge a plurality of channels containing memory cells to be programmed.

SUMMARY

One aspect of the present disclosure is related to a method of performing an erasing operation in a memory device. The method includes the step of preparing a memory block that includes an array of memory cells that are arranged in a plurality of word lines. The plurality of word lines include a plurality of edge word lines and a plurality of non-edge word lines. The plurality of word lines also includes a first group of word lines to be erased in a first erase pulse of an erase loop and a second group of word lines to be erased in a second erase pulse of the erase loop. In the first erase pulse, the method continues with the steps of applying a first inhibit voltage to the non-edge word lines of the second group of word lines and applying a higher second inhibit voltage to the edge word lines of the second group of word lines. In the second erase pulse, the method proceeds with the steps of applying the first inhibit voltage to the non-edge word lines of the first group of word lines and applying the higher second inhibit voltage to the edge word lines of the second group of word lines.

According to another aspect of the present disclosure, the second inhibit voltage is equal to the first inhibit voltage plus a bias voltage.

According to yet another aspect of the present disclosure, the bias voltage is at least 1 V.

According to still another aspect of the present disclosure, the bias voltage is no greater than 4 V.

According to a further aspect of the present disclosure, after the second erase pulse, the method continues with the step of conducting an erase verify operation on the memory block. In response to the erase verify operation passing, the method proceeds with the step of ending the erasing operation. In response to the erase verify operation failing, the method continues with the step of incrementally increasing a magnitude of an erase pulse and beginning an additional erase loop.

According to yet a further aspect of the present disclosure, the word lines of the first group of word line alternate with the word lines of the second group of word lines.

According to still a further aspect of the present disclosure, the plurality of edge word lines includes a data word line that is nearest a source side of the memory block and a data word line that is nearest a drain side of the memory block.

According to another aspect of the present disclosure, the plurality of edge word lines includes a pair of data word lines that are located in a central area of the memory block and are adjacent dummy word lines that do not contain data.

Another aspect of the present disclosure is related to a memory device that includes a memory block with an array of memory cells that are arranged in a plurality of word lines. The plurality of word lines include a plurality of edge word lines and a plurality of non-edge word lines. The plurality of word lines also include a first group of word lines to be erased in a first erase pulse of an erase loop and a second group of word lines to be erased in a second erase pulse of the erase loop. The memory device also includes circuitry that is configured to erase the plurality of memory cells in the memory block in an erasing operation. During the erasing operation, the circuitry is configured to, in the first erase pulse, apply a first inhibit voltage to the non-edge word lines of the second group of word lines and apply a higher second inhibit voltage to the edge word lines of the second group of word lines. In the second erase pulse, the circuitry is configured to apply the first inhibit voltage to the non-edge word lines of the first group of word lines and apply the higher second inhibit voltage to the edge word lines of the second group of word lines.

According to another aspect of the present disclosure, the second inhibit voltage is equal to the first inhibit voltage plus a bias voltage.

According to yet another aspect of the present disclosure, the bias voltage is at least 1 V.

According to still another aspect of the present disclosure, the bias voltage is no greater than 4 V.

According to a further aspect of the present disclosure, the circuitry is further configured to, after the second erase pulse, conduct an erase verify operation on the memory block. In response to the erase verify operation passing, the circuitry is configured to end the erasing operation. In response to the erase verify operation failing, the circuitry is configured to incrementally increase a magnitude of an erase pulse and begin an additional erase loop.

According to yet a further aspect of the present disclosure, the word lines of the first group of word lines alternate with the word lines of the second group of word lines.

According to still a further aspect of the present disclosure, the plurality of edge word lines includes a data word line that is nearest a source side of the memory block and a data word line that is nearest a drain side of the memory block.

According to another aspect of the present disclosure, the plurality of edge word lines further includes a pair of data word lines that are located in a central area of the memory block and are adjacent dummy word lines that do not contain data.

Yet another aspect of the present disclosure is related to an apparatus that includes a memory block with an array of memory cells that are arranged in a plurality of word lines.

The plurality of word lines include a plurality of edge word lines and a plurality of non-edge word lines. The plurality of word lines also include a first group of word lines to be erased in a first erase pulse of an erase loop and a second group of word lines to be erased in a second erase pulse of the erase loop. The apparatus also includes an erasing means for erasing the plurality of memory cells in the memory block in an erasing operation. During the erasing operation, the erasing means is configured to, in the first erase pulse, apply a first inhibit voltage to the non-edge word lines of the second group of word lines and apply a second inhibit voltage to the edge word lines of the second group of word lines. The second inhibit voltage is equal to the first inhibit voltage plus a bias voltage. In the second erase pulse, the erasing means is configured to apply the first inhibit voltage to the non-edge word lines of the first group of word lines and apply the higher second inhibit voltage to the edge word lines of the second group of word lines.

According to another aspect of the present disclosure, the bias voltage is in the range of 1 to 4 V.

According to yet another aspect of the present disclosure, the erasing means is further configured to, after the second erase pulse, conduct an erase verify operation on the memory block. In response to the erase verify operation passing, the erasing means is configured to end the erasing operation. In response to the erase verify operation failing, the erasing means is configured to incrementally increase a magnitude of an erase pulse and begin an additional erase loop.

According to still another aspect of the present disclosure, the word lines of the first group of word lines alternate with the word lines of the second group of word lines.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope. The disclosure is described and explained with added specificity and detail through the use of the accompanying drawings in which:

FIG. 2 depicts blocks of memory cells in an example two-dimensional configuration of the memory array of FIG. 1A;

FIG. 7A depicts a top view of an example word line layer WL0 of the stack of FIG. 6B;

FIG. 7B depicts a top view of an example top dielectric layer DL116 of the stack of FIG. 6B;

FIG. 10 is a table depicting the voltages applied to a plurality of components in a memory block during an exemplary stripe erase operation;

FIG. 13 is a table depicting the voltages applied to a plurality of components in a memory block during an exemplary stripe erase operation.

DESCRIPTION OF THE ENABLING EMBODIMENTS

The present disclosure is related to erasing techniques that result in a less extreme erase depth for some memory cells (specifically, the memory cells of edge word lines) that are erased in a memory block. These techniques include a so-called "stripe erase" process where the memory cells of every other word line are erased in a first pulse of an erase loop and the memory cells of the remaining word lines are erased in a second erase pulse of the same erase loop. During each of the first and second pulses, an elevated (or boosted) inhibit voltage is applied to one or more unselected edge word lines to thereby prevent the memory cells in those edge word lines from being more deeply erased than the memory cells of the other word lines. This reduces damage to the memory block during the erasing operation and improves the memory device's endurance and operating life.

Figures 1A, 1B:
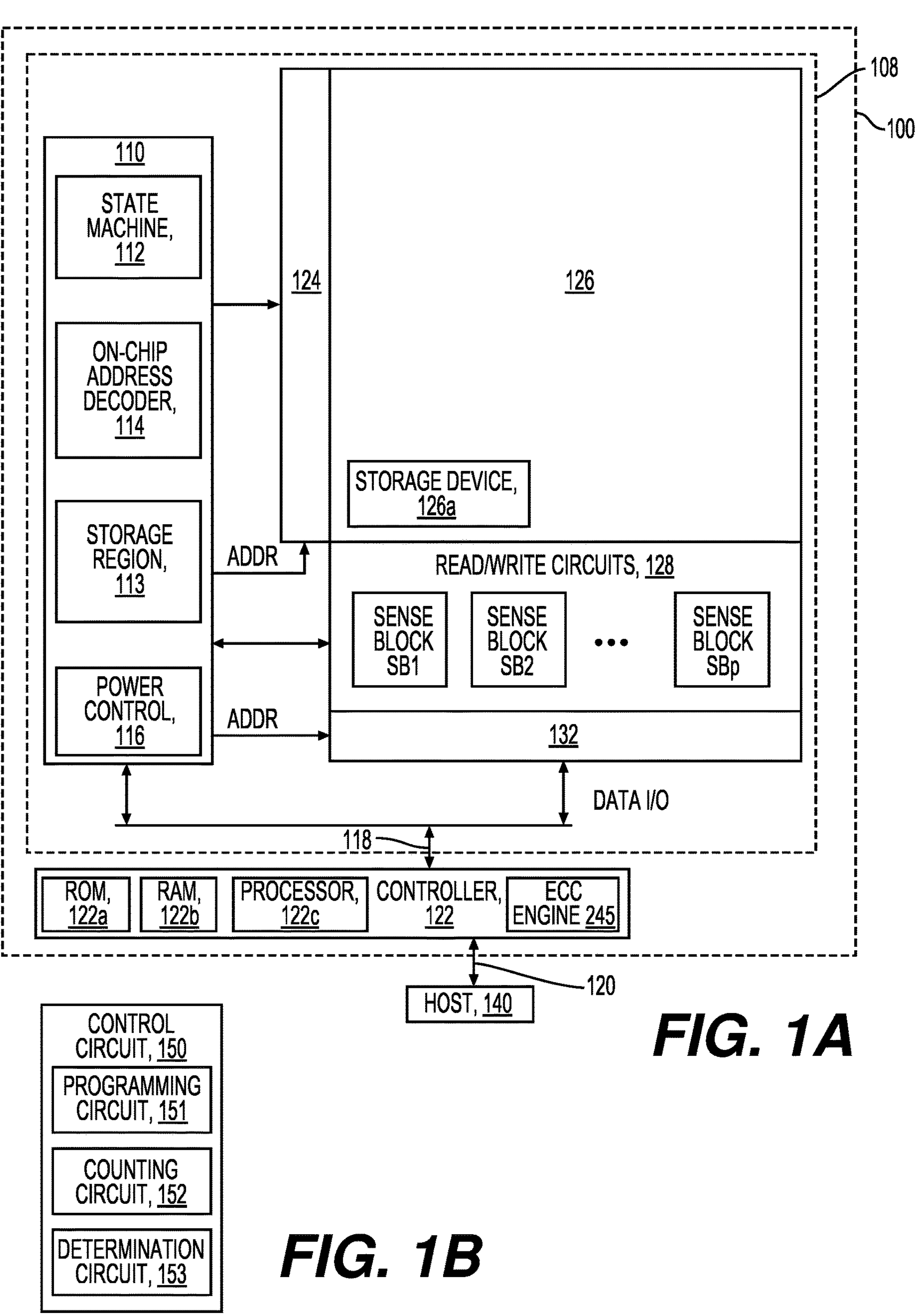
FIG. 1A is a block diagram of an example memory device.
FIG. 1B is a block diagram of an example control circuit.

FIG. 1A is a block diagram of an example memory device 100 is configured to program the memory cells in the word lines of a memory block according to the erasing techniques of the subject disclosure. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure 126 can be two-dimensional or three-dimensional. The memory structure 126 may comprise one or more array of memory cells including a three-dimensional array. The memory structure 126 may comprise a monolithic three-dimensional memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits 150 can include a programming circuit 151 configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one selected word line after which the programming circuit applies a verification signal to the selected word line. The control circuits 150 can also include a counting circuit 152 configured to obtain a count of memory cells which pass a verify test for the one data state. The control circuits 150 can also include a determination circuit 153 configured to determine, based on an amount by which the count exceeds a threshold, if a programming operation is completed.

For example, FIG. 1B is a block diagram of an example control circuit 150 which comprises the programming circuit 151, the counting circuit 152, and the determination circuit 153.

The off-chip controller 122 may comprise a processor 122*c*, storage devices (memory) such as ROM 122*a* and RAM 122*b* and an error-correction code (ECC) engine 245. The ECC engine can correct a number of read errors which are caused when the upper tail of a Vt distribution becomes too high. However, uncorrectable errors may exist in some cases. The techniques provided herein reduce the likelihood of uncorrectable errors.

The storage device(s) 122*a*, 122*b* comprise, code such as a set of instructions, and the processor 122*c* is operable to execute the set of instructions to provide the functionality described herein. Alternately or additionally, the processor 122*c* can access code from a storage device 126*a* of the memory structure 126, such as a reserved area of memory cells in one or more word lines. For example, code can be used by the controller 122 to access the memory structure 126 such as for programming, read and erase operations. The code can include boot code and control code (e.g., set of instructions). The boot code is software that initializes the controller 122 during a booting or startup process and enables the controller 122 to access the memory structure 126. The code can be used by the controller 122 to control one or more memory structures 126. Upon being powered up, the processor 122*c* fetches the boot code from the ROM 122*a* or storage device 126*a* for execution, and the boot code initializes the system components and loads the control code into the RAM 122*b*. Once the control code is loaded into the RAM 122*b*, it is executed by the processor 122*c*. The control code includes drivers to perform basic tasks such as controlling and allocating memory, prioritizing the processing of instructions, and controlling input and output ports.

Figure 1C:
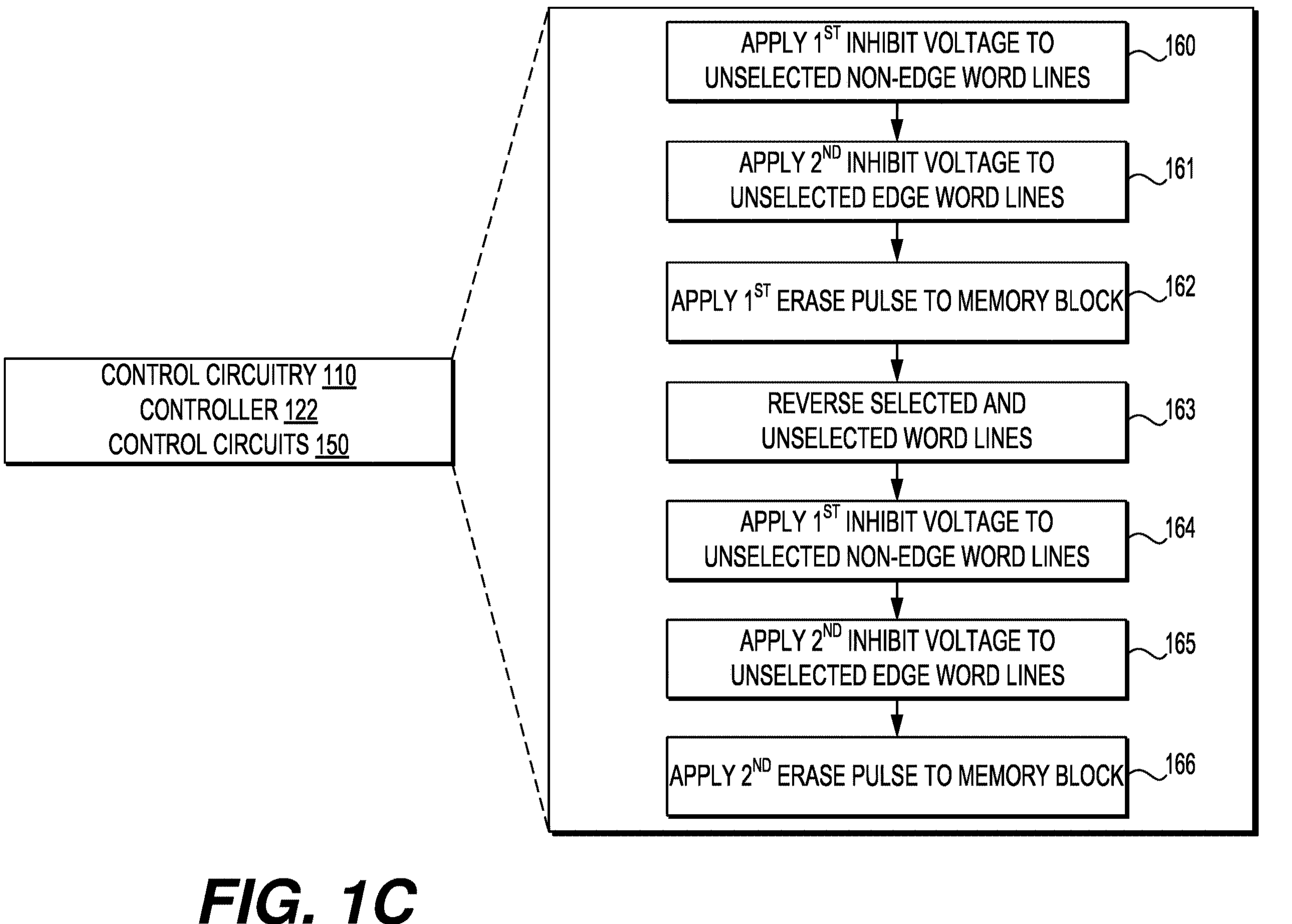
FIG. 1C is a block diagram of example circuitry of the memory device of FIG. 1A.

Generally, the control code can include instructions to perform the functions described herein including the steps of the flowcharts discussed further below and provide the voltage waveforms including those discussed further below. For example, as illustrated in FIG. 1C, the control circuitry 110, controller 122, control circuits 150, and/or any other circuitry are configured/programmed at step 160 to apply a first inhibit voltage to a plurality of unselected non-edge word lines in the memory block. At step 161, a second inhibit voltage, which is greater than the first inhibit voltage, is applied to at least one unselected edge word line in the memory block. At step 162, an erase pulse at an erase voltage VERA is applied to the memory block to erase the memory cells of a plurality of selected word lines. At step 163, the selected and unselected word lines are reversed, i.e., the previously selected word lines become unselected and the previously unselected word lines become selected. At step 164, the first inhibit voltage is applied to the unselected non-edge word lines. At step 165, the second inhibit voltage is applied to at least one unselected edge word line. At step 166, the erase pulse at the erase voltage VERA is applied to the memory block to erase the memory cells of the selected word line. These steps are discussed in further detail below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

FIG. 2 illustrates memory blocks 200, 210 of memory cells in an example two-dimensional configuration of the memory array 126 of FIG. 1. The memory array 126 can include many such blocks 200, 210. Each example block 200, 210 includes a number of NAND strings and respective bit lines, e.g., BL0, BL1, . . . which are shared among the blocks. Each NAND string is connected at one end to a drain-side select gate (SGD), and the control gates of the drain-side select gates are connected via a common SGD line. The NAND strings are connected at their other end to a source-side select gate (SGS) which, in turn, is connected to a common source line 220. One hundred and twelve word lines, for example, WL0-WL111, extend between the SGSs and the SGDs. In some embodiments, the memory block may include more or fewer than one hundred and twelve word lines. For example, in some embodiments, a memory block includes one hundred and sixty-four word lines. In some cases, dummy word lines, which contain no user data, can also be used in the memory array adjacent to the select gate transistors or between certain data word lines. Such dummy word lines can shield the edge data word line from certain edge effects.

Figures 3A, 3B:
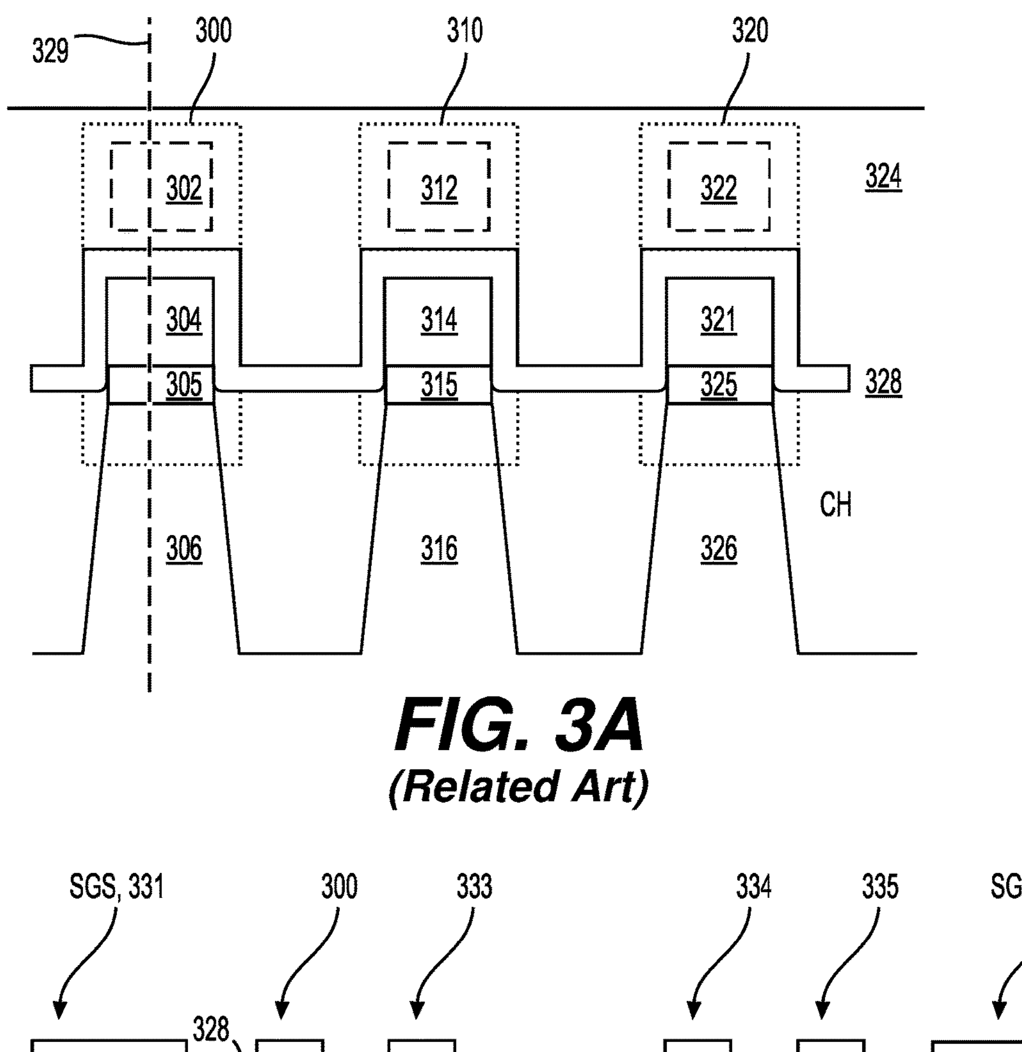
FIG. 3A and FIG. 3B depict cross-sectional views of example floating gate memory cells in NAND strings.

One type of non-volatile memory which may be provided in the memory array is a floating gate memory, such as of the type shown in FIGS. 3A and 3B. However, other types of non-volatile memory can also be used. As discussed in further detail below, in another example shown in FIGS. 4A and 4B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A illustrates a cross-sectional view of example floating gate memory cells 300, 310, 320 in NAND strings. In this Figure, a bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell 300, 310, 320 is in a different respective NAND string. An inter-poly dielectric (IPD) layer 328 is also illustrated. The control gates 302, 312, 322 are portions of the word line. A cross-sectional view along contact line connector 329 is provided in FIG. 3B.

The control gate 302, 312, 322 wraps around the floating gate 304, 314, 321, increasing the surface contact area between the control gate 302, 312, 322 and floating gate 304, 314, 321. This results in higher IPD capacitance, leading to a higher coupling ratio which makes programming and erase easier. However, as NAND memory devices are scaled down, the spacing between neighboring cells 300, 310, 320 becomes smaller so there is almost no space for the control gate 302, 312, 322 and the IPD layer 328 between two adjacent floating gates 302, 312, 322.

Figures 4A, 4B:
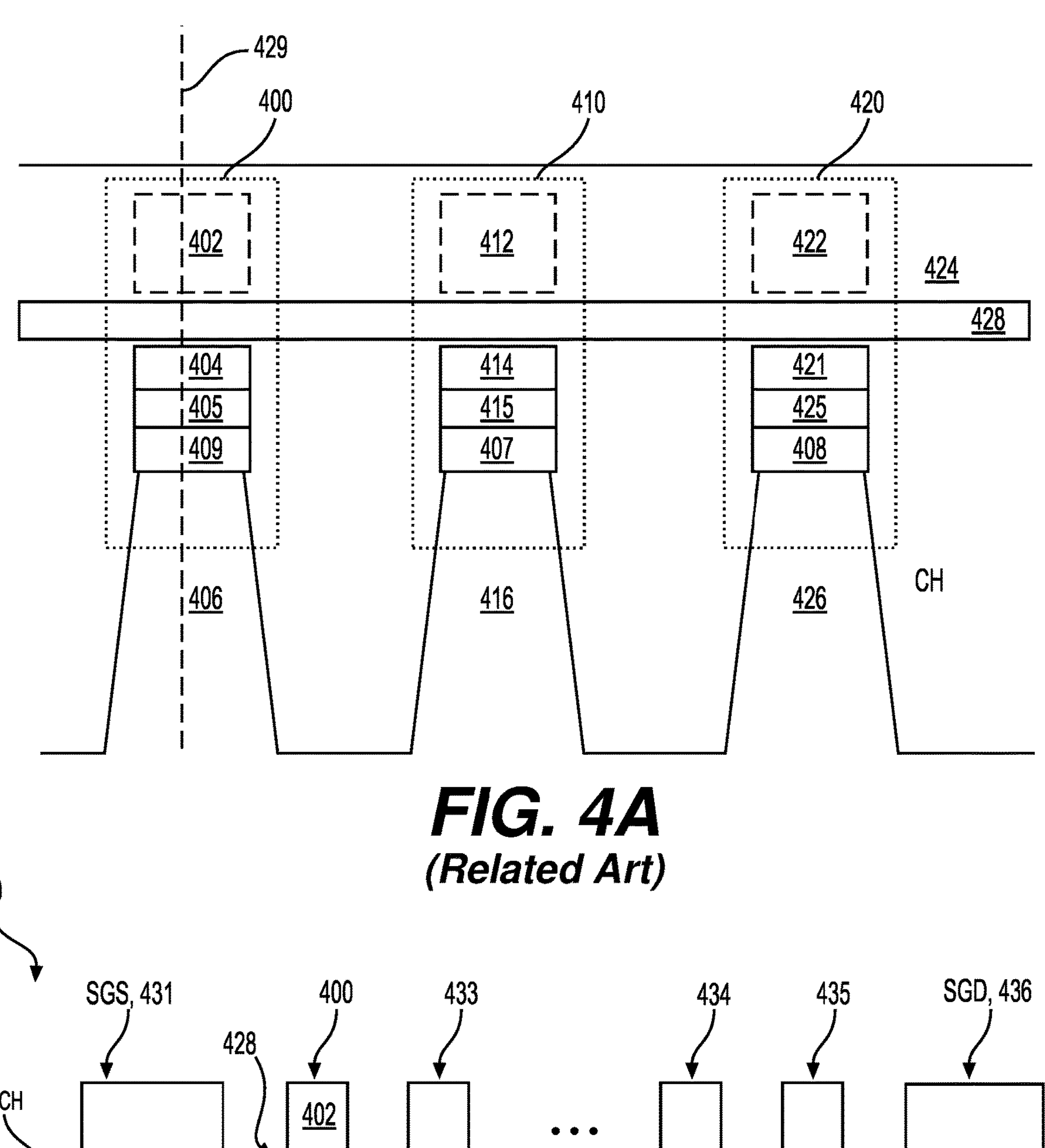
FIG. 4A and FIG. 4B depict cross-sectional views of example charge-trapping memory cells in NAND strings.

As an alternative, as shown in FIGS. 4A and 4B, the flat or planar memory cell 400, 410, 420 has been developed in which the control gate 402, 412, 422 is flat or planar; that is, it does not wrap around the floating gate and its only contact with the charge storage layer 428 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 4A depicts a cross-sectional view of example charge-trapping memory cells 400, 410, 420 in NAND strings. The view is in a word line direction of memory cells 400, 410, 420 comprising a flat control gate and charge-trapping regions as a two-dimensional example of memory cells 400, 410, 420 in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 424 extends across NAND strings which include respective channel regions 406, 416, 426. Portions of the word line provide control gates 402, 412, 422. Below the word line is an IPD layer 428, charge-trapping layers 404, 414, 421, polysilicon layers 405, 415, 425, and tunneling layers 409, 407, 408. Each charge-trapping layer 404, 414, 421 extends continuously in a respective NAND string. The flat configuration of the control gate can be made thinner than a floating gate. Additionally, the memory cells can be placed closer together.

FIG. 4B illustrates a cross-sectional view of the structure of FIG. 4A along contact line connector 429. The NAND string 430 includes an SGS transistor 431, example memory cells 400, 433, . . . 435, and an SGD transistor 436. Passageways in the IPD layer 428 in the SGS and SGD transistors 431, 436 allow the control gate layers 402 and floating gate layers to communicate. The control gate 402 and floating gate layers may be polysilicon and the tunnel oxide layer may be silicon oxide, for instance. The IPD layer 428 can be a stack of nitrides (N) and oxides (O) such as in a N—O—N—O—N configuration.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well. A channel voltage, Vch, may be applied directly to the channel region of the substrate.

Figure 5:
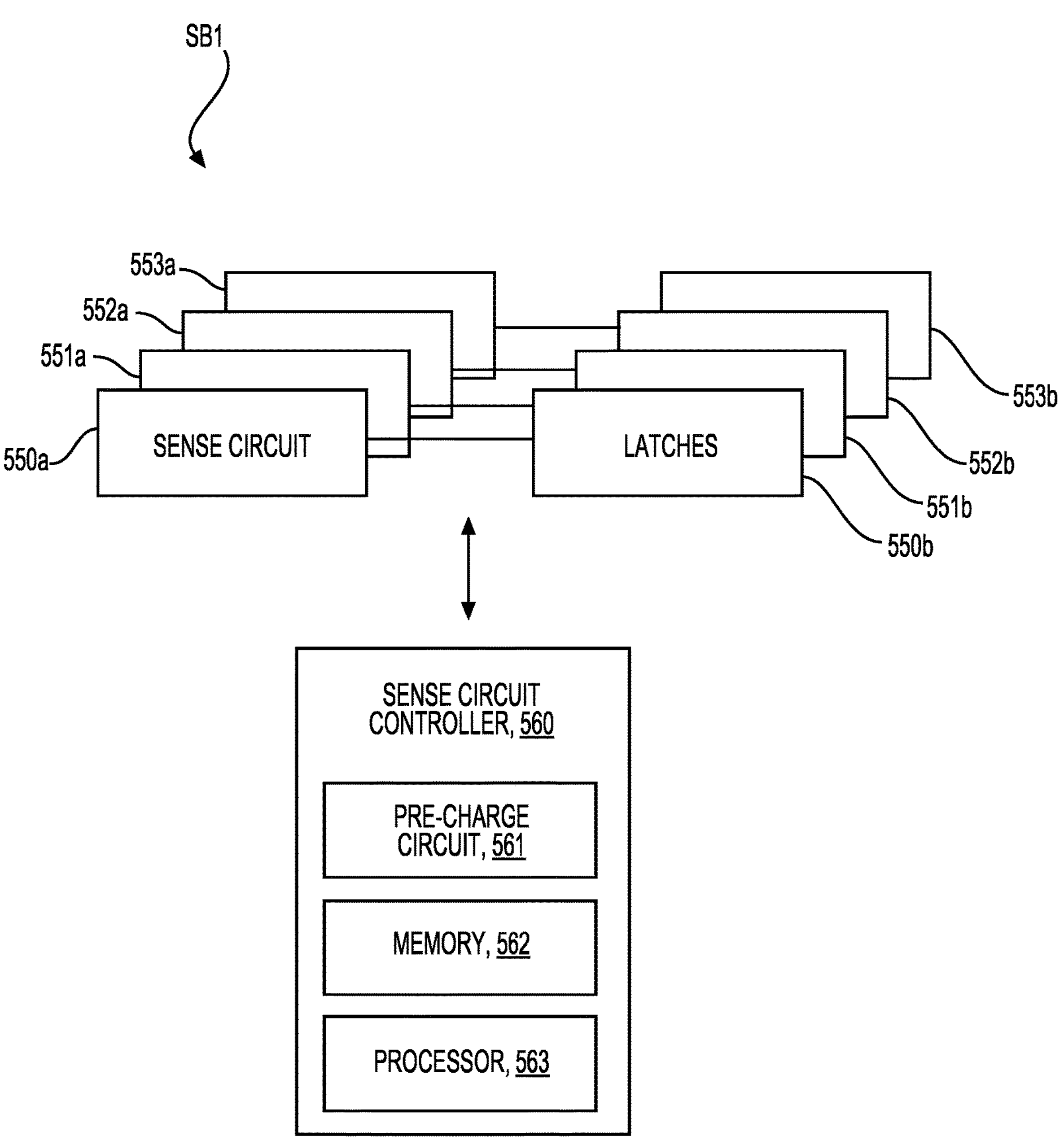
FIG. 5 depicts an example block diagram of the sense block SB1 of FIG. 1.

FIG. 5 illustrates an example block diagram of the sense block SB1 of FIG. 1. In one approach, a sense block comprises multiple sense circuits. Each sense circuit is associated with data latches. For example, the example sense circuits 550*a*, 551*a*, 552*a*, and 553*a* are associated with the data latches 550*b*, 551*b*, 552*b*, and 553*b*, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller 560 may include a pre-charge circuit 561 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 560 may also include a pre-charge circuit 561, a memory 562 and a processor 563. The memory 562 may store code which is executable by the processor to perform the functions described herein. These functions can include reading the latches 550*b*, 551*b*, 552*b*, 553*b* which are associated with the sense circuits 550*a*, 551*a*, 552*a*, 553*a*, setting bit values in the latches and providing voltages for setting pre-charge levels in sense nodes of the sense circuits 550*a*, 551*a*, 552*a*, 553*a*. Further example details of the sense circuit controller 560 and the sense circuits 550*a*, 551*a*, 552*a*, 553*a* are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 6A:
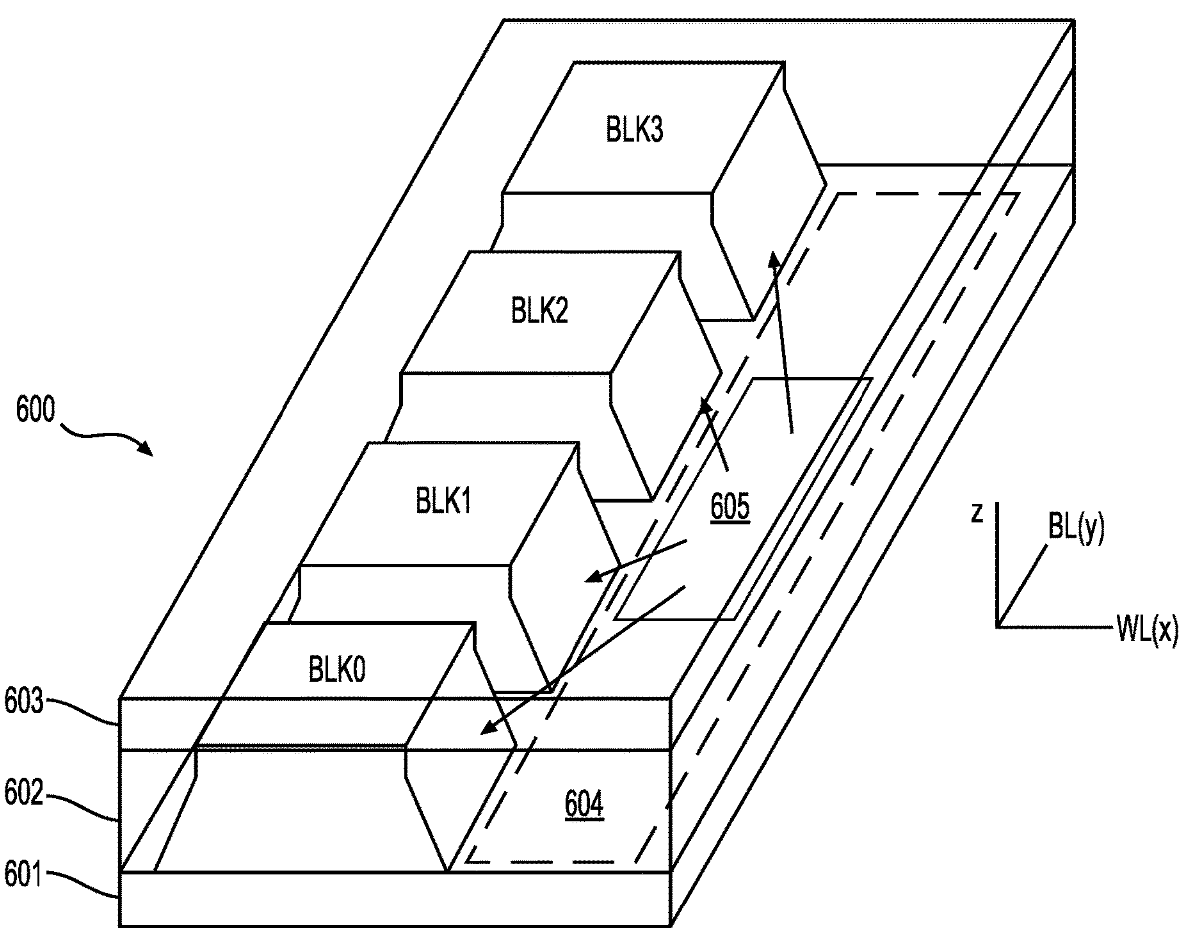
FIG. 6A is a perspective view of a set of blocks in an example three-dimensional configuration of the memory array of FIG. 1.

FIG. 6A is a perspective view of a set of blocks 600 in an example three-dimensional configuration of the memory array 126 of FIG. 1. On the substrate are example blocks BLK0, BLK1, BLK2, BLK3 of memory cells (storage elements) and a peripheral area 604 with circuitry for use by the blocks BLK0, BLK1, BLK2, BLK3. For example, the circuitry can include voltage drivers 605 which can be connected to control gate layers of the blocks BLK0, BLK1, BLK2, BLK3. In one approach, control gate layers at a common height in the blocks BLK0, BLK1, BLK2, BLK3 are commonly driven. The substrate 601 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 602 of the memory device. In an upper region 603 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
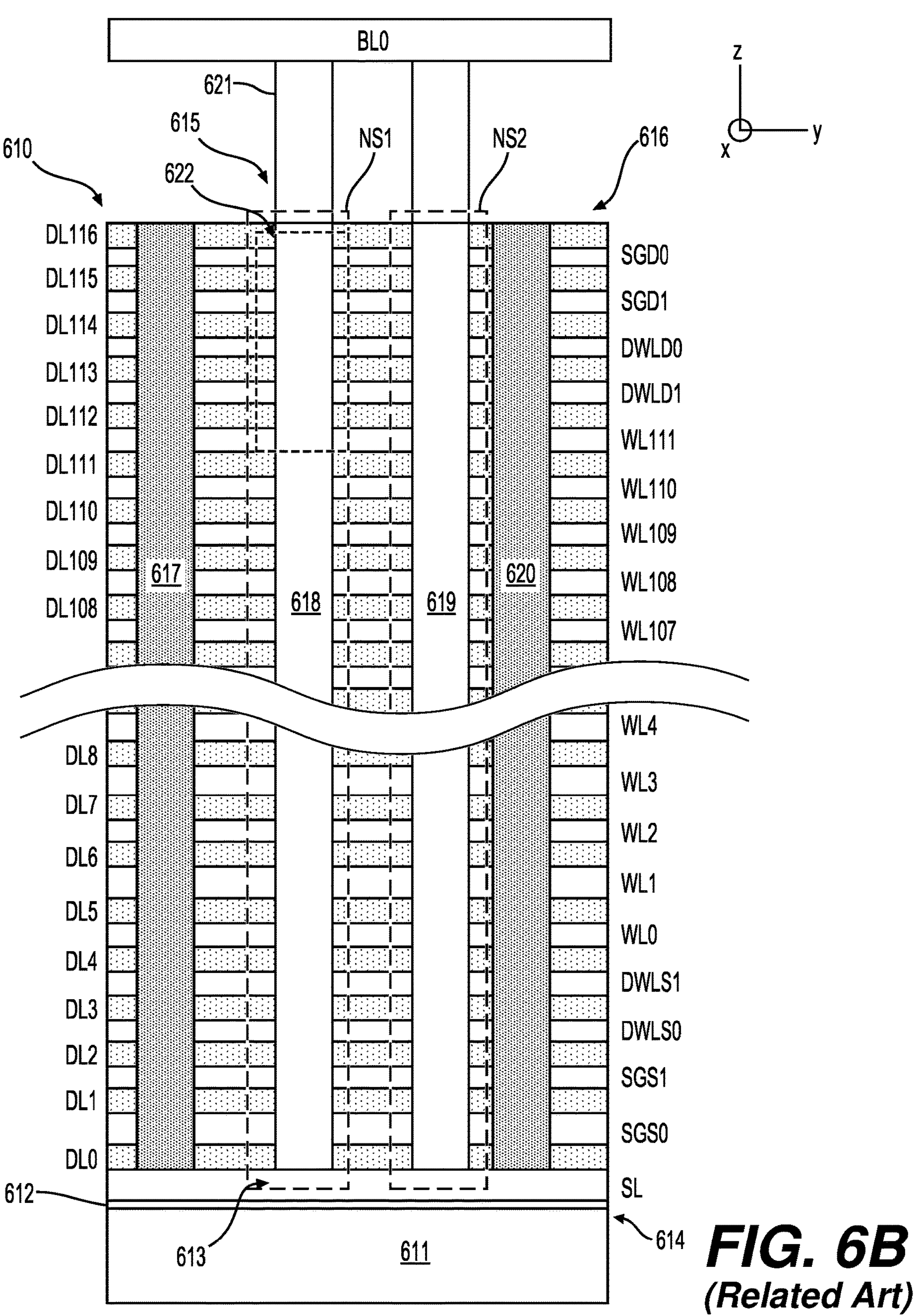
FIG. 6B depicts an example cross-sectional view of a portion of one of the blocks of FIG. 6A.

FIG. 6B illustrates an example cross-sectional view of a portion of one of the blocks BLK0, BLK1, BLK2, BLK3 of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WL0-WL111. The dielectric layers are labelled as DL0-DL116. Further, regions of the stack 610 which comprise NAND strings NS1 and NS2 are illustrated. Each NAND string encompasses a memory hole 618, 619 which is filled with materials which form memory cells adjacent to the word lines. A region 622 of the stack 610 is shown in greater detail in FIG. 6D and is discussed in further detail below. The dielectric layers can have variable thicknesses such that some of the conductive layers can be closer to or further from neighboring conductive layers. The thicknesses of the dielectric layers affects the "ON pitch," which is a factor in memory density. Specifically, a smaller ON pitch allows for more memory cells in a given area but may compromise reliability.

The stack 610 includes a substrate 611, an insulating film 612 on the substrate 611, and a portion of a source line SL. NS1 has a source-end 613 at a bottom 614 of the stack and a drain-end 615 at a top 616 of the stack 610. Contact line connectors (e.g., slits, such as metal-filled slits) 617, 620 may be provided periodically across the stack 610 as interconnects which extend through the stack 610, such as to connect the source line to a particular contact line above the stack 610. The contact line connectors 617, 620 may be used during the formation of the word lines and subsequently filled with metal. A portion of a bit line BL0 is also illustrated. A conductive via 621 connects the drain-end 615 to BL0.

Figure 6C:
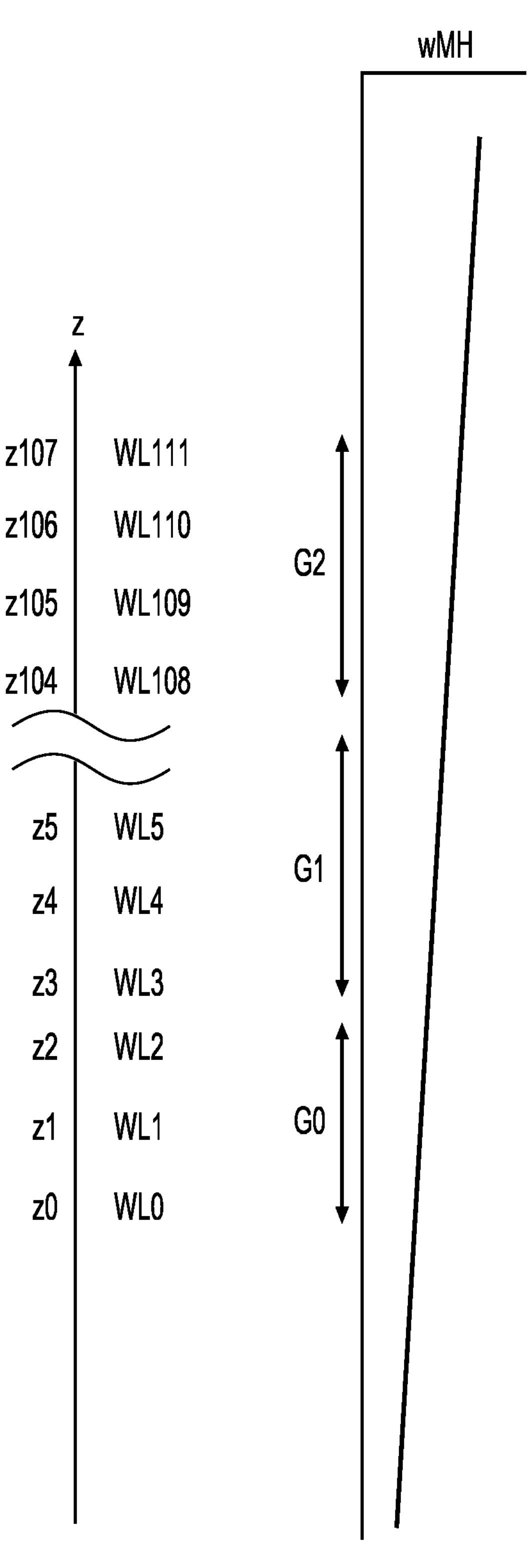
FIG. 6C depicts a plot of memory hole diameter in the stack of FIG. 6B.

FIG. 6C illustrates a plot of memory hole diameter in the stack of FIG. 6B. The vertical axis is aligned with the stack of FIG. 6B and illustrates a width (wMH), e.g., diameter, of the memory holes 618 and 619. The word line layers WL0-WL111 of FIG. 6A are repeated as an example and are at respective heights z0-z111 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Figure 6D:
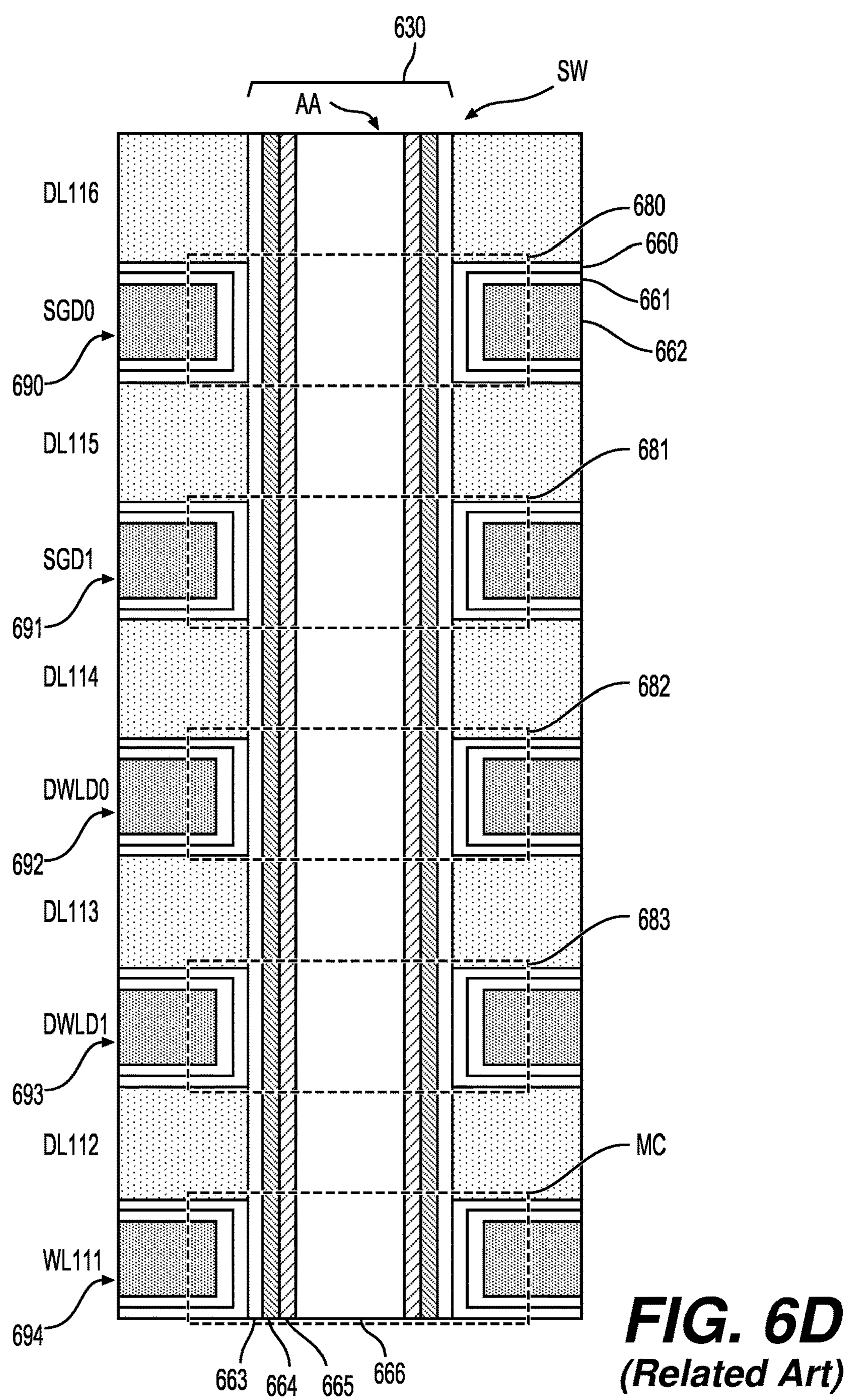
FIG. 6D depicts a close-up view of region 622 of the stack of FIG. 6B.

FIG. 6D illustrates a close-up view of the region 622 of the stack 610 of FIG. 6B. Memory cells are formed at the different levels of the stack at the intersection of a word line layer and a memory hole. In this example, SGD transistors 680, 681 are provided above dummy memory cells 682, 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole 630) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal such as Tungsten as a control gate. For example, control gates 690, 691, 692, 693, and 694 are provided. In this example, all of the layers except the metal are provided in the memory hole 630. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The threshold voltage Vt of a memory cell is increased in proportion to the amount of stored charge. During a sensing operation, the threshold voltage Vt is detected or measured. During an erase operation, the electrons return to the channel.

Each of the memory holes 630 can be filled with a plurality of annular layers comprising a blocking oxide layer, a charge trapping layer 663, a tunneling layer 664 and a channel layer. A core region of each of the memory holes 630 is filled with a body material, and the plurality of layers are between the core region and the word line layer in each of the memory holes 630. In some cases, the charge trapping layer 663 and the tunneling layer 664 are annular in shape. In other cases, as discussed in further detail below, these layers are semi-circular in shape.

The NAND string can be considered to have a floating body channel because the length of the channel is not formed on a substrate. Further, the NAND string is provided by a plurality of word line layers above one another in a stack, and separated from one another by dielectric layers.

FIG. 7A illustrates a top view of an example word line layer WL0 of the stack 610 of FIG. 6B. As mentioned, a three-dimensional memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a three-dimensional memory device can be divided into sub-blocks, where each sub-block comprises a NAND string group which has a common SGD control line. For example, see the SGD lines/control gates SGD0, SGD1, SGD2 and SGD3 in the sub-blocks SBa, SBb, SBc and SBd, respectively. Further, a word line layer in a block can be divided into regions. Each region is in a respective sub-block and can extend between contact line connectors (e.g., slits) which are formed periodically in the stack to process the word line layers during the fabrication process of the memory device. This processing can include replacing a sacrificial material of the word line layers with metal. Generally, the distance between contact line connectors should be relatively small to account for a limit in the distance that an etchant can travel laterally to remove the sacrificial material, and that the metal can travel to fill a void which is created by the removal of the sacrificial material. For example, the distance between contact line connectors may allow for a few rows of memory holes between adjacent contact line connectors. The layout of the memory holes and contact line connectors should also account for a limit in the number of bit lines which can extend across the region while each bit line is connected to a different memory cell. After processing the word line layers, the contact line connectors can optionally be filed with metal to provide an interconnect through the stack.

In this example, there are four rows of memory holes between adjacent contact line connectors. A row here is a group of memory holes which are aligned in the x-direction. Moreover, the rows of memory holes are in a staggered pattern to increase the density of the memory holes. The word line layer or word line is divided into regions WL0*a*, WL0*b*, WL0*c* and WL0*d* which are each connected by a contact line 713. The last region of a word line layer in a block can be connected to a first region of a word line layer in a next block, in one approach. The contact line 713, in turn, is connected to a voltage driver for the word line layer. The region WL0*a* has example memory holes 710, 711 along a contact line 712. The region WL0*b* has example memory holes 714, 715. The region WL0*c* has example memory holes 716, 717. The region WL0*d* has example memory holes 718, 719. The memory holes are also shown in FIG. 7B. Each memory hole can be part of a respective NAND string. For example, the memory holes 710, 714, 716 and 718 can be part of NAND strings NS0_SBa, NS1_SBb, NS2_SBc, NS3_SBd, and NS4_SBe, respectively.

Each circle represents the cross-section of a memory hole at a word line layer or SG layer. Example circles shown with dashed lines represent memory cells which are provided by the materials in the memory hole and by the adjacent word line layer. For example, memory cells 720, 721 are in WL0*a*, memory cells 724, 725 are in WL0*b*, memory cells 726, 727 are in WL0*c*, and memory cells 728, 729 are in WL0*d*. These memory cells are at a common height in the stack.

Contact line connectors (e.g., slits, such as metal-filled slits) 701, 702, 703, 704 may be located between and adjacent to the edges of the regions WL0*a*-WL0*d*. The contact line connectors 701, 702, 703, 704 provide a conductive path from the bottom of the stack to the top of the stack. For example, a source line at the bottom of the stack may be connected to a conductive line above the stack, where the conductive line is connected to a voltage driver in a peripheral region of the memory device.

FIG. 7B illustrates a top view of an example top dielectric layer DL116 of the stack of FIG. 6B. The dielectric layer is divided into regions DL116*a*, DL116*b*, DL116*c* and DL116*d*. Each region can be connected to a respective voltage driver. This allows a set of memory cells in one region of a word line layer being programmed concurrently, with each memory cell being in a respective NAND string which is connected to a respective bit line. A voltage can be set on each bit line during each programming, sensing, or erasing operation.

The region DL116*a* has the example memory holes 710, 711 along a contact line 712, which is coincident with a bit line BL0. A number of bit lines extend above the memory holes and are connected to the memory holes as indicated by the "X" symbols. BL0 is connected to a set of memory holes which includes the memory holes 711, 715, 717, 719. Another example bit line BL1 is connected to a set of memory holes which includes the memory holes 710, 714, 716, 718. The contact line connectors (e.g., slits, such as metal-filled slits) 701, 702, 703, 704 from FIG. 7A are also illustrated, as they extend vertically through the stack. The bit lines can be numbered in a sequence BL0-BL23 across the DL116 layer in the x-direction.

Different subsets of bit lines are connected to memory cells in different rows. For example, BL0, BL4, BL8, BL12, BL16, BL20 are connected to memory cells in a first row of cells at the right-hand edge of each region. BL2, BL6, BL10, BL14, BL18, BL22 are connected to memory cells in an adjacent row of cells, adjacent to the first row at the right-hand edge. BL3, BL7, BL11, BL15, BL19, BL23 are connected to memory cells in a first row of cells at the left-hand edge of each region. BL1, BL5, BL9, BL13, BL17, BL21 are connected to memory cells in an adjacent row of memory cells, adjacent to the first row at the left-hand edge.

Figures 8, 9:
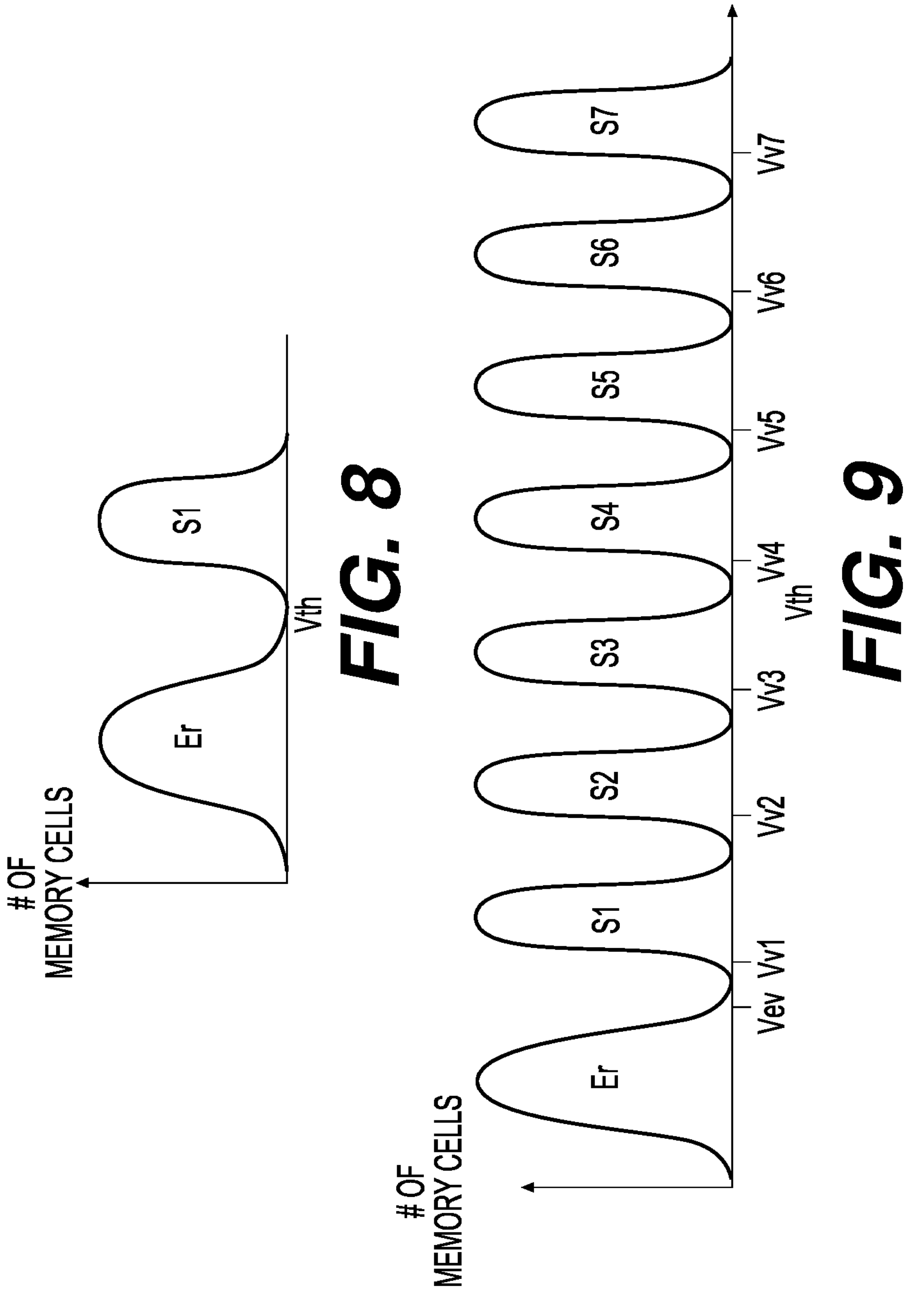
FIG. 8 depicts a threshold voltage distribution of a page of memory cells programmed to one bit per memory cell (SLC)
FIG. 9 depicts a threshold voltage distribution of a page of memory cells programmed to three bits per memory cell (TLC)

The memory cells of the memory blocks can be programmed to store one or more bits of data in multiple data states, each of which is associated with a respective threshold voltage Vt range and with a respective bit or series of bits. For example, FIG. 8 depicts a threshold voltage Vt distribution of a group of memory cells programmed according to a one bit per memory cell (SLC) storage scheme. In the SLC storage scheme, there are two total data states, including the erased state (Er) and a single programmed data state (S1). FIG. 9 illustrates the threshold voltage Vt distribution of a three bits per cell (TLC) storage scheme that includes eight total data states, namely the erased state (Er) and seven programmed data states (S1, S2, S3, S4, S5, S6, and S7). Each programmed data state (S1-S7) is associated with a respective verify voltage (Vv1-Vv7), which is employed during a verify portion of a programming operation. Similarly, each programmed data state is associated with a unique read voltage that can be the same or different than the respective verify voltages. Other storage schemes are also available, such as two bits per cell (MLC) with four data states, four bits per cell (QLC) with sixteen data states, or five bits per cell (PLC) with thirty-two data states.

Programming the memory cells occurs on a word line-by-word line basis from one side of the memory block towards an opposite side of the memory block. In contrast, erase typically occurs on a block or sub-block basis.

An erase operation involves transitioning the memory cells from the programmed state to the erased state. Thus, during the erase operation, it is desired to lower the threshold voltage Vt of each memory cell below an erase-verify level Vev (see FIG. 9). The erase operation can include a number of erase loops, where each loop comprises an erase portion followed by a verify portion. In the erase portion, voltages are applied to the memory block to provide a positive channel-to-gate voltage for the memory cells of the memory block to drive electrons out of the charge-storing material of the memory cells, thereby reducing the threshold voltages Vt of the memory cells. In the verify portion, a verify voltage Vev is applied to the control gates of the memory cells via the word lines of the memory block and sensing circuitry is used to sense currents in the NAND strings to determine if the memory cells have been sufficiently erased.

Another type of erase operation is sometimes known as a “stripe erase” operation. In a stripe erase operation, instead of the memory cells of all of the word lines being erased at the same time, in each erase loop the memory cells of every other word line are first erased simultaneously with a first erase pulse and then the memory cells of the remaining word lines are next erased with a second erase pulse. For example, all of the even word lines may be erased with the first erase pulse and then all of the odd word lines may be erased with the second erase pulse. With reference to FIG. 10, to accomplish this, during the first pulse (Erase Pulse 1), a plurality of selected word lines (e.g., the even word lines) are biased to a low voltage (e.g., 0.5 V) for a deep erase while the remaining word lines (the unselected word lines) are biased to an inhibit voltage (WLU1_ERA) for a shallow erase. In the second erase pulse (Erase Pulse 2), the word line bias pattern reverses. That is, during the second pulse, the word lines that received the low voltage during the first pulse now receive the higher voltage and the word lines that received the higher voltage during the first pulse now receive the low voltage. This allows for more holes to move to the low bias word lines instead of between word lines, thereby reducing parasitic holes trapped between word lines and improving data retention (DR) threshold voltage and Vt margin. The benefit is more significant with further ON shrink and worse lateral DR.

In FIG. 10, WLN is a last data word line on a source side of the memory block; WL0 is a first data word line on a drain side of the memory block; and WLe1 and WLe2 are mid-block edge word lines that contain data and are located adjacent a joint between an upper memory hole and a lower memory hole. Typically, one or more (for example, two) dummy word lines that do not contain data will be located at the joint between the upper and lower memory holes and between the mid-block edge word lines WLe1, WLe2. Also, one or more dummy word lines that do not contain data are typically found adjacent the first and last word lines (WL0, WLN) in the memory block, and thus, because they are adjacent dummy word lines that do not contain data, the first and last word lines (WL0, WLN) are also considered to be edge word lines because they also are adjacent word lines that do not contain data.

Figure 11:
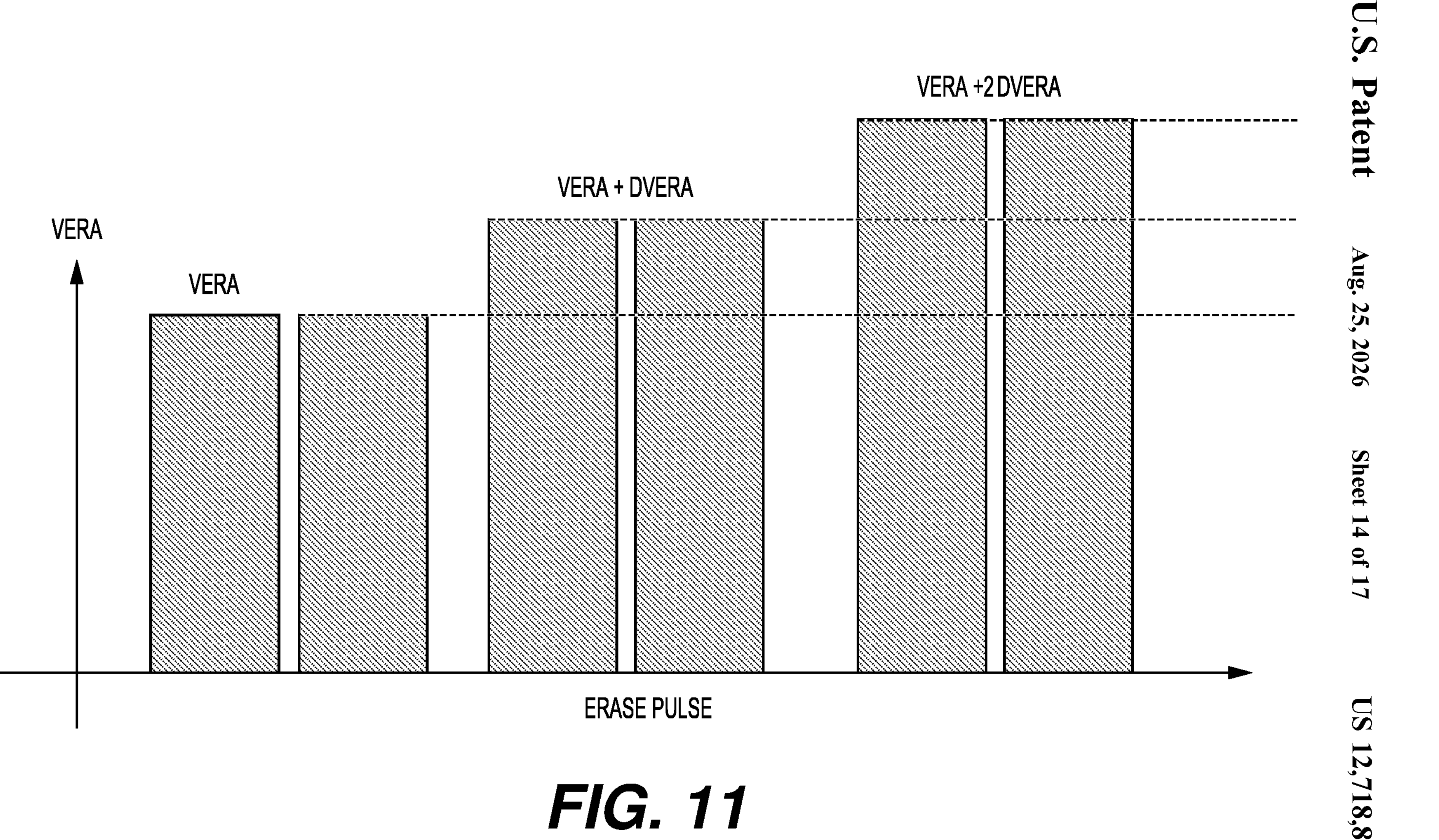
FIG. 11 is a plot illustrating the erase voltages applied to a selected memory block during a plurality of erase loops in an example stripe erase operation.

Turning now to FIG. 11, during each erase loop, the same erase voltage VERA is applied to the memory block during each of the two erase pulses of a single erase loop. Between erase loops, this erase voltage VERA is increased by a fixed step size DVERA, i.e., VERA=VERA+DVERA.

Figure 12B:
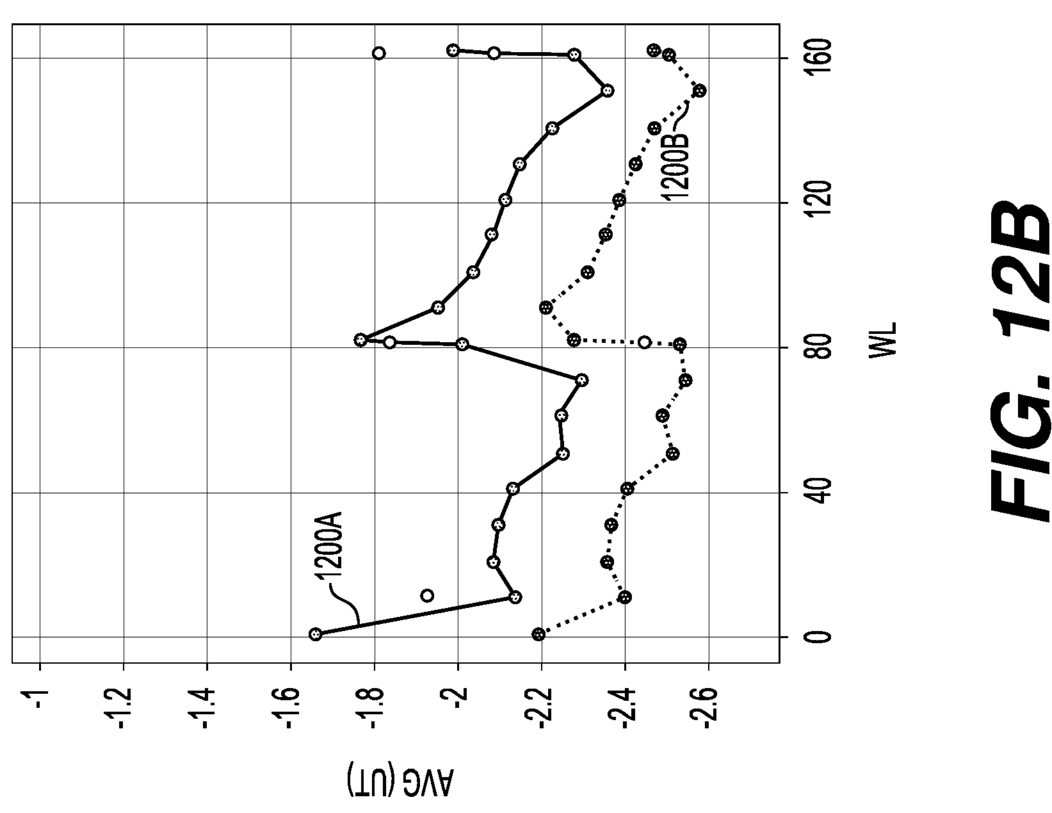
FIG. 12B illustrates the measured upper tail of a plurality of erased memory cells following a normal erase operation and a stripe erase operation in a bad block.
Figure 12A:
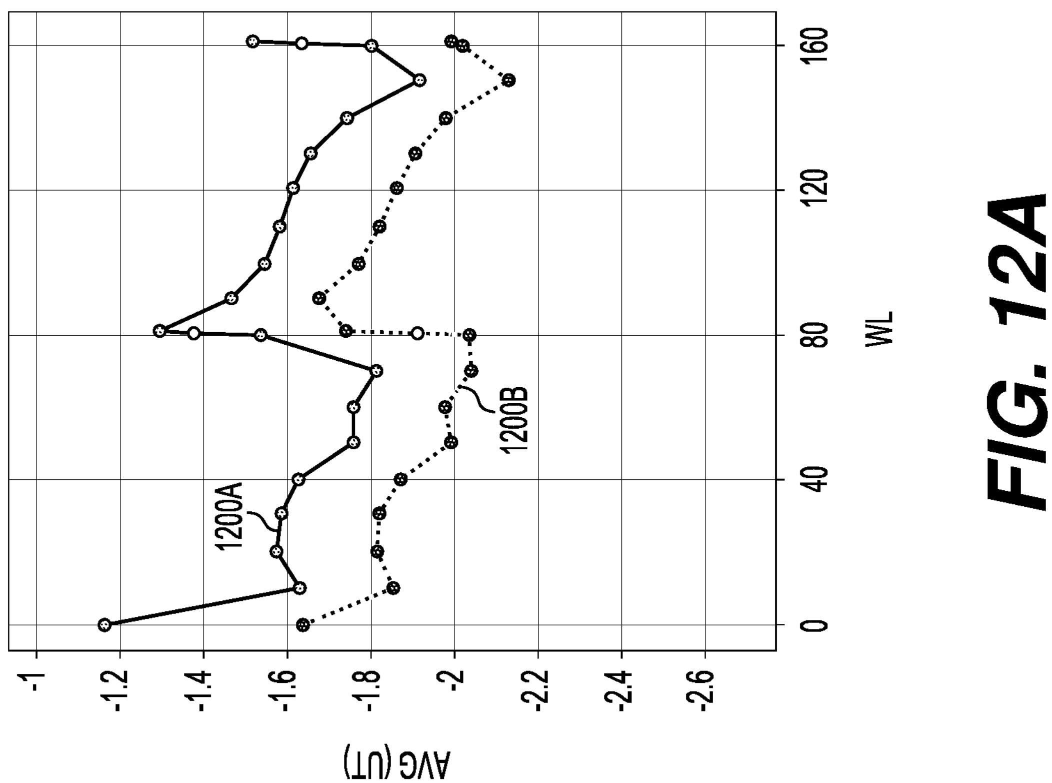
FIG. 12A illustrates the measured upper tail of a plurality of erased memory cells following a normal erase operation and a stripe erase operation in a good block.

In some cases, it has been found that stripe erase will erase the memory cells of a memory block significantly more deeply (e.g., to a more negative voltage) than a “normal erase” operation where the memory cells of all of the word are erased simultaneously. Further, this deep erase in some circumstances, may be exacerbated in the edge word lines WL0, WLe1, WLe2, WLN as compared to the remaining word lines. In other words, in some cases, the voltage difference between normal erase and stripe erase is greater at the edge word lines than at the remaining (non-edge) word lines. This effect is illustrated in FIGS. 12A and 12B, which each depict a measured average erased state upper tail versus the word lines in an example memory block that has undergone both normal erase (1200*a*, 1202*a*) and stripe erase (1200*b*, 1202*b*). As illustrated, there is a greater difference between the upper tails for the edge word lines than the non-edge word lines, and this greater difference is present both in a “bad block” (FIG. 12A) and a “good block” (FIG. 12B). In one example, the voltage difference between normal erase and stripe erase is approximately 0.8 Volts in both good and bad blocks at the edge word lines and is approximately 0.3 V at the non-edge word lines.

According to the present disclosure, the edge word lines are erased less deeply during stripe erase by applying an increased inhibit voltage to the edge word lines during the erase pulses where they are unselected as compared to the non-edge unselected word lines. For example, as illustrated in FIG. 13, during Erase Pulse 1, the inhibit voltage applied to the non-edge unselected word lines is a first inhibit voltage WLU1_ERA and the inhibit voltage applied to unselected edge word lines WLN and WLe1 is a second inhibit voltage which greater than the first inhibit voltage by a bias voltage, i.e., WLU1_ERA+BIAS. Similarly, during Erase Pulse 2, the voltages applied to the unselected word lines WL0 and WLe2 are increased by the bias voltage (WLU1_ERA+BIAS) as compared to the non-edge unselected word lines. By increasing the voltage that is applied to the edge word lines during the erase pulses where they are unselected, the erase rate is reduced for the edge word lines such that they experience a similar erase to the non-edge word liens.

In an example embodiment, the base voltage WLU1_ERA that is applied to unselected word lines during each of the erase pulses is approximately three and a half Volts (3.5 V). In some embodiments, the bias voltage BIAS may be one to four Volts (1-4 V). More specifically, depending on certain factors, the bias voltage BIAS can be selected to be any of one to four Volts, i.e., 1 V, 2 V, 3 V, or 4 V. The bias voltage BIAS can be selected with only a two bit design parameter, thereby allowing the design of the erase circuitry in the memory device to be simplified as compared to other approaches that might solve the above-discussed erase depth issue.

By reducing the erase depth of the edge word lines compared to other approaches, die electric degradation is reduced, thereby improving the endurance of the memory block and the operating life of the memory device. The erase techniques of the present disclosure achiever these advantages with little to no performance penalty as compared to other stripe erase techniques.

Figure 14:
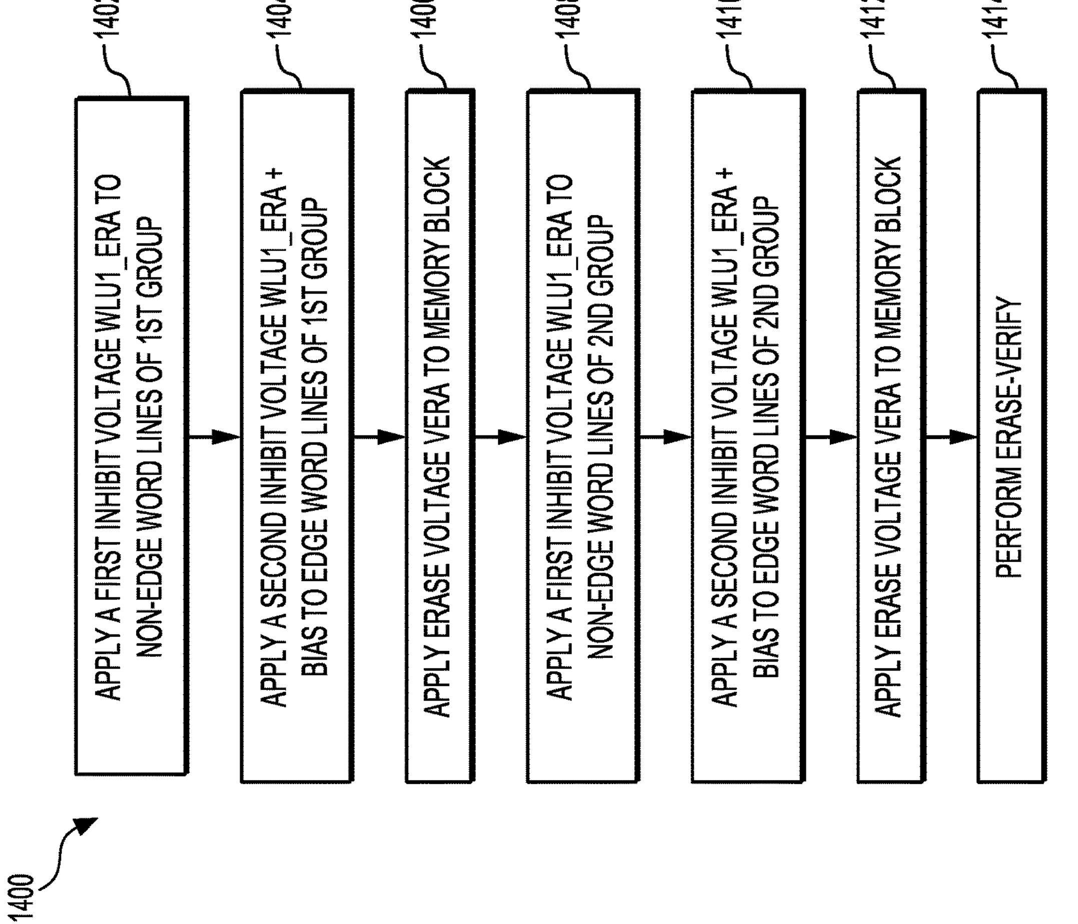
FIG. 14 is a flow chart illustrating the steps of performing a stripe erase operation according to an exemplary embodiment of the present disclosure.

Turning now to FIG. 14, a flow chart 1400 is provided that depicts the steps of erasing the memory cells of a memory device according to an example embodiment. These steps could be performed by the controller; a processor or processing device an erasing means or any other circuitry, executing instructions stored in memory; and or other circuitry described herein that is specifically configured/programmed to execute the following steps.

At step 1402, a first inhibit voltage WLU1_ERA is applied to the non-edge word lines of a first group of word lines, which may include all of the odd word lines in the memory block (WL1, WL3, WL5, etc.). At step 1404, a second inhibit voltage WLU1_ERA+BIAS is applied to the edge word lines of the first group of word lines, e.g., WLN. In the exemplary embodiment, the bias voltage BIAS can be in the range of one to four Volts (1-4 V). At step 1406, a very low voltage or near zero voltage is applied to the word lines of a second group (e.g., all of the even word lines in the memory block), and an erase voltage VERA is applied to the memory block to perform a first erase pulse of a program loop. During the first erase pulse, the memory cells in the word lines of the second group are erased (have their threshold voltages Vt reduced) while the memory cells in the word lines of the first group are mostly inhibited from erase.

After step 1406 is completed, at step 1408, the first inhibit voltage WLU1_ERA is applied to the non-edge word lines of the second group. At step 1410, the second inhibit voltage WLU1_ERA is applied to the edge word lines of the second group. In the exemplary embodiment, the bias voltage BIAS can be in the range of one to four Volts (1-4 V). At step 1412, a very low voltage or near zero voltage is applied to the word lines of the first group, and the erase voltage VERA is applied to the memory block to perform a second erase pulse of the program loop. During the second erase pulse, the memory cells in the word lines of the first group are erased while the memory cells in the word lines of the second group are mostly inhibited from erase.

At step 1414, an erase-verify operation is performed on the memory cells of the memory block. That is, the threshold voltages Vt of the memory cells of the memory block are compared to an erase verify voltage Vev. If at least a predetermined number of memory cells have threshold voltages Vt that are less than the erase verify voltage Vev, then the erase-verify operation passes. Otherwise, the erase-verify operation fails. If the erase-verify operation passes, the erasing operation is completed. If the erase-verify operation fails, then the erase voltage VERA is incrementally increased (VERA=VERA+DVERA) and a new erase loop begins.

Various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. By way of example, "a processor" programmed to perform various functions refers to one processor programmed to perform each and every function or more than one processor collectively programmed to perform each of the various functions. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application to thereby enable others skilled in the art to best utilize the technology in various embodiments and with various modifications as are suited to the particular use contemplated. The scope of the technology is defined by the claims appended hereto.

What is claimed is:

1. A method of performing an erasing operation in a memory device, comprising the steps of:

preparing a memory block that includes an array of memory cells that are arranged in a plurality of word lines, the plurality of word lines including a plurality of edge word lines and a plurality of non-edge word lines, the plurality of word lines also including a first group of word lines to be erased in a first erase pulse of an erase loop and a second group of word lines to be erased in a second erase pulse of the erase loop;

in the first erase pulse, applying a first inhibit voltage to the non-edge word lines of the second group of word lines and applying a higher second inhibit voltage to the edge word lines of the second group of word lines; and in the second erase pulse, applying the first inhibit voltage to the non-edge word lines of the first group of word lines and applying the higher second inhibit voltage to the edge word lines of the second group of word lines.

2. The method as set forth in claim 1, wherein the higher second inhibit voltage is equal to the first inhibit voltage plus a bias voltage.

3. The method as set forth in claim 2, wherein the bias voltage is at least 1 V.

4. The method as set forth in claim 3, wherein the bias voltage is no greater than 4 V.

5. The method as set forth in claim 1, further including the steps of:

after the second erase pulse, conducting an erase verify operation on the memory block;

in response to the erase verify operation passing, ending the erasing operation; and in response to the erase verify operation failing, incrementally increasing a magnitude of an erase pulse and beginning an additional erase loop.

6. The method as set forth in claim 1, wherein the word lines of the first group of word line alternate with the word lines of the second group of word lines.

7. The method as set forth in claim 1, wherein the plurality of edge word lines includes a data word line that is nearest a source side of the memory block and a data word line that is nearest a drain side of the memory block.

8. The method as set forth in claim 7, wherein the plurality of edge word lines includes a pair of data word lines that are located in a central area of the memory block and are adjacent dummy word lines that do not contain data.

9. A memory device, comprising: a memory block that includes an array that has a plurality of memory cells that are arranged in a plurality of word lines, the plurality of word lines including a plurality of edge word lines and a plurality of non-edge word lines, the plurality of word lines also including a first group of wordlines to be erased in a first erase pulse of an erase loop and a second group of word lines to be erased in a second erase pulse of the erase loop; circuitry configured to erase the plurality of memory cells in the memory block in an erasing operation, during the erasing operation, the circuitry being configured to: in the first erase pulse, apply a first inhibit voltage to the non-edge word lines of the second group of word lines and apply a higher second inhibit voltage to the edge word lines of the second group of word lines; and in the second erase pulse, apply the first inhibit voltage to the non-edge word lines of the first group of word lines and apply the higher second inhibit voltage to the edge word lines of the second group of word lines.

10. The memory device as set forth in claim 9, wherein the higher second inhibit voltage is equal to the first inhibit voltage plus a bias voltage.

11. The memory device as set forth in claim 10, wherein the bias voltage is at least 1 V.

12. The memory device as set forth in claim 11, wherein the bias voltage is no greater than 4 V.

13. The memory device as set forth in claim 9, wherein the circuitry is further configured to:

after the second erase pulse, conduct an erase verify operation on the memory block;

in response to the erase verify operation passing, end the erasing operation; and in response to the erase verify operation failing, incrementally increase a magnitude of an erase pulse and begin an additional erase loop.

14. The memory device as set forth in claim 9, wherein the word lines of the first group of word lines alternate with the word lines of the second group of word lines.

15. The memory device as set forth in claim 9, wherein the plurality of edge word lines includes a data word line that is nearest a source side of the memory block and a data word line that is nearest a drain side of the memory block.

16. The memory device as set forth in claim 15, wherein the plurality of edge word lines further includes a pair of data word lines that are located in a central area of the memory block and are adjacent dummy word lines that do not contain data.

17. An apparatus, comprising: a memory block that includes an array with a plurality of memory cells that are arranged in a plurality of word lines, the plurality of word lines including a plurality of edge word lines and a plurality of non-edge word lines, the plurality of word lines also including a first group of word lines to be erased in a first erase pulse of an erase loop and a second group of word lines to be erased in a second erase pulse of the erase loop; an erasing means for erasing the plurality of memory cells in the memory block in an erasing operation, during the erasing operation, the erasing means being configured to: in the first erase pulse, apply a first inhibit voltage to the non-edge word lines of the second group of word lines and apply a higher second inhibit voltage to the edge wordlines of the second group of word lines, the higher second inhibit voltage being equal to the first inhibit voltage plus a bias voltage; and in the second erase pulse, apply the first inhibit voltage to the non-edge word lines of the first group of word lines and apply the higher second inhibit voltage to the edge word lines of the second group of word lines.

18. The apparatus as set forth in claim 17, wherein the bias voltage is in the range of 1 to 4 V.

19. The apparatus as set forth in claim 17, wherein the erasing means is further configured to:

after the second erase pulse, conduct an erase verify operation on the memory block;

in response to the erase verify operation passing, end the erasing operation; and in response to the erase verify operation failing, incrementally increase a magnitude of an erase pulse and begin an additional erase loop.

20. The apparatus as set forth in claim 17, wherein the word lines of the first group of word lines alternate with the word lines of the second group of word lines.

* * * * *